CONTROL DEVICES FOR THERMOELECTRIC MEANS

Filed Aug. 29, 1962

INVENTOR.
KENNETH E. GROSS &
BY RICHARD E. FUHRMAN

ATTORNEY
Sidney N. Rosenfeld

United States Patent Office 3,131,545
Patented May 5, 1964

3,131,545

CONTROL DEVICES FOR THERMOELECTRIC MEANS

Kenneth E. Gross and Richard E. Fuhrman, York, Pa., assignors to Borg-Warner Corporation, Chicago, Ill., a corporation of Illinois Filed Aug. 29, 1962, Ser. No. 220,188
12 Claims. (Cl. 62—3)

This invention relates to a thermal conditioning system employing a thermoelectric module for conditioning an atmosphere. More specifically, the invention relates to a refrigeration system, although also applicable to a heating system, for controlling the direct current output of a rectifier which drives the module in response to variations from a desired temperature.

When two materials of dissimilar thermoelectric properties are joined and a direct current is passed therethrough, the junction temperature changes, with respect to the ambient temperture, and either increases or decreases depending upon the direction of the current flowing through the junction. This phenomenon is known as the Peltier effect and exists in all junctions of dissimilar materials to some extent. Some materials or alloys, due to a combination of thermal and electrical properties, produce heating or cooling effects that are many times the magnitude of others and these materials are called thermoelectric materials. For example, thermal junctions formed between certain alloys of lead, bismuth or antimony combined in varying quantities with tellurium or selenium and having controlled amounts of impurities, such as gold, silver, or sulfur, have exhibited heating and cooling properties of a magnitude that can be usefully employed as heating or cooling devices to the fields of air conditioning and refrigeration.

A thermoelectric heating and cooling device, in its simplest form comprises an array of thermoelectric elements of dissimilar thermoelectric properties connected in series by a plurality of connector links of heat and electrically conductive material. A direct current is passed through the series connected array and the thermal junctions become either hot or cold depending upon the direction of current flowing therethrough. All hot junctions are usually segregated from cold junctions by means of heat insulating material inserted between the respective junctions. The cold junctions and their associated conductor links then produce a cooling effect in one ambient, while the hot junctions and their associated conductor links dissipate heat to another ambient. Thus, the conductor links connecting the dissimilar thermoelectric members not only serve to conduct electrical current between the thermoelectric materials but also act as heat exchange surfaces through which heat is transferred to and from the ambients adjacent thereto.

In many conditioning systems which control temperatures about a steady state quiescent or control point, it is necessary to employ some type of feedback between the cold or heat producing device or mechanism and the atmosphere which is to be cooled or heated for the purpose of sensing departures from the control or steady state temperature of the controlled atmosphere. Such feedback means have assumed many forms and with the common refrigeration cycle employing a motor driven compressor, a condenser and an evaporator a wide variety of feedback systems and devices have evolved over the years. A well-known example of such feedback arrangements is afforded by the common thermostat in a household refrigerator. The thermostat is often a bimetallic electrical switch whose on-off action controls the compressor motor. Thus, the entire refrigeration system is either fully on or fully off and there is no modulation or small step control of the refrigerating action. In other feedback refrigeration systems it has been possible to effect a modulating action of the refrigeration mechanism by employing less than the entire capacity of the system for relatively small departures from the control temperature. The overruns and underruns from the predetermined level ae consequently smaller and a finer degree of control realized.

In prior refrigeration systems, the degree of modulation has been fixed by the nature of conventional refrigeration systems. For example, if a compressor having a plurality of cylinders is employed, less than all of the cylinders may be used for only small variations from the control temperature while the entire capacity would be used for large variations. Practical considerations, however, have limited the fineness of control attainable since the size of the cylinders in a multicylinder compressor cannot decrease indefinitely nor can their number increase indefinitely.

With the advent of efficient thermoelectric cooling devices it is also often desirable to provide a feedback arrangement to control the temperature but because of the great difference in operation between a conventional refrigeration system and the more recent thermoelectric cooling devices, recourse to teachings from past feedback systems for controlling the temperature in the refrigerated atmosphere has been of little or no value.

It is therefore an object of this invention to provide a feedback arrangement for controlling the temperature in an atmosphere conditioned by thermoelectric means.

It is a further object of this invention to provide a refrigeration system employing thermoelectric means for cooling in combination with means for rectifying alternating current to thereby drive the thermoelectric cooling means.

It is another object of the present invention to provide a feedback arrangement for a refrigeration system employing thermoelectric cooling means and a rectifier for supplying power to the thermoelectric device wherein the feedback varies the periodicity of a control element in the rectifying means to thereby vary the rectified current to the thermoelectric device.

It is another object of the present invention to provide a refrigeration system employing thermoelectric conditioning means with a feedback control enabling a thermoelectric module to respond to variations of any degree from a control temperature.

In carrying out one form of the illustrated form of the invention, an element having a temperature dependent electrical property is placed in heat exchange relationship with an atmosphere whose temperature is to be controlled. The temperature sensitive element is part of a capacitor charging circuit whose rate of charge controls a rectifier output which drives the thermoelectric device. The time required for the capacitor in the charging circuit to attain a predetermined charge may thus be associated with a periodicity since the action repeatedly occurs.

While the specific embodiment of the invention described hereinafter relates to a refrigeration system, the invention is also applicable to a heating system.

Figure 1:
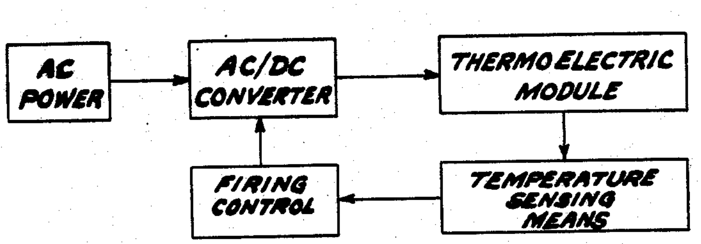
FIGURE 1 is a block diagram of the components of the conditioning system of this invention.

Referring now to FIGURE 1 of the drawings, an alternating current power source feeds into an A.C./D.C. rectifier whose variable direct current output is fed into a thermoelectric module. The specific thermoelectric module selected for the practice of this invention may be one of many different types currently available commercially. Many types of such modules having a relatively high efficiency are now well known. For refrigeration, the cold side of the module is placed in proximity with a heat exchange medium and may, for example, be situated abutting a wall of a container whose interior is to be refrigerated. The cold side of the module is thus in heat exchange relationship with the interior. A temperature sensing means having a temperature dependent electrical property is also placed in heat exchange relationship with the medium to be conditioned. Variations in the electrical property of the temperature sensing means are fed into a firing control means which controls the output of the A.C./D.C. rectifier.

According to one embodiment of the invention, the electrical property which is temperature dependent is resistance and the temperature sensing element used is commonly referred to as a thermistor. Such devices are readily available commercially and exhibit, with present production techniques, great stability in their temperature vs. resistance characteristic. Further, such devices exhibit a stable resistance-temperature characteristic over great periods of time and are hence well suited for use in a conditioning system adapted for long usage without repair or replacement.

Figure 2:
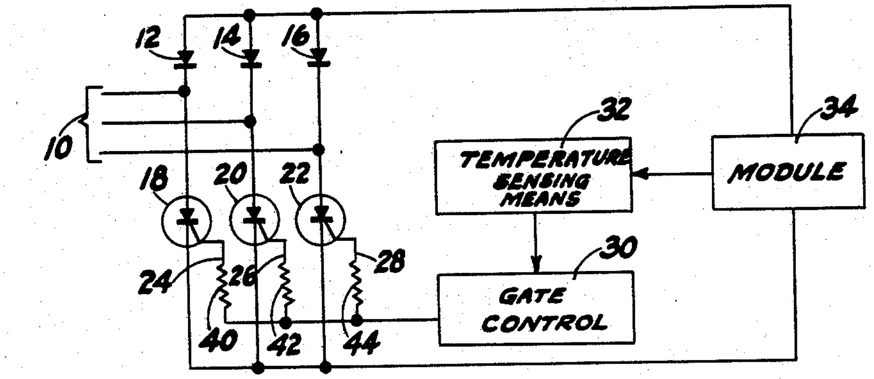
FIGURE 2 is a partially schematic and partially block diagram of the conditioning system of this invention.

Referring now to FIGURE 2 of the drawings, a three phase refrigeration system according to this invention is illustrated and includes a three phase alternating current supply denoted by the numeral 10. Conventional rectifiers 12, 14 and 16 are in combination with silicon controlled rectifiers 18, 20 and 22 in the corresponding legs of the circuit. Silicon controlled rectifiers may be regarded as the solid state equivalent of the more familiar gas-filled thyratron or ignitron. A silicon controlled rectifier (SCR) may be termed a three element device or gate controlled rectifier and comprises an anode, a cathode and a gate. With the anode positive with respect to the cathode, current through the SCR is still zero until the appearance on the gate of a suitable signal. Upon a suitable gate signal, each SCR conducts and continues to pass current limited only by the external impedance. After zero current, corresponding to the appearance of the negative half-cycle of the external A.C. supply upon the anode of the SCR, for a short period (10–20 microsec.), each SCR reverts to blocking. Each silicon controlled rectifier includes gates 24, 26 and 28 connected to a gate control element 30 through, respectively, resistances 40, 42 and 44. A temperature sensing means 32 is coupled to the gate control and is in heat exchange relationship with the medium conditioned by a thermoelectric module 34. The gate control element 30 supplies pulses to the gates 24, 26 and 28 of the silicon controlled rectifiers 18, 20 and 22 respectively and the conduction of the latter is thus controlled by the output of the gate control. The gate control 30 embraces any device susceptible of supplying pulses of varying periodicity to the gates in response to variations in the electrical property of temperature sensing means 32.

In operation, the three silicon control rectifiers 18, 20 and 22 are successively pulsed three times during each three phase cycle from the gate control 30. If the pulses applied to the gates 24, 26 and 28 are in synchronism with the main supply voltage 10, it will be seen that the silicon control rectifiers conduct as though they were conventional rectifiers and the module 34 receives maximum power. If the temperature of the (refrigerated) atmosphere falls below a desired control temperature, the rectified current passing through the module must be diminished to thereby diminish the abstraction of heat from the controlled atmosphere. With an RC controlled relaxation oscillator (to be described in detail later) as the gate control 30, a decrease in temperature effects an increase in the (thermistor) resistance of 32 and this increase varies the periodicity of the pulses fed to the gates 24, 26 and 28, effectively introducing a time lag or electrical angle between the positive half-waves of the input 10 and the pulsing of the gates. This diminishes the D.C. output to the module 34 and causes a corresponding decrease in cooling action. The temperature then approaches the desired control point. In practice, it will be seen that the gate control periodicity is initially set such that the thermoelectric module 34 receives less than maximum rectified output in order that the D.C. output and hence cooling effect may be increased or decreased upon a temperature variation from the control temperature.

Figure 3:
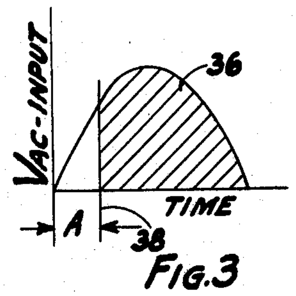
FIGURE 3 is a schematic view showing the variation in D.C. rectified output with an electrical angle A for a positive cycle of a single phase A.C. input.

Reference now to FIGURE 3 of the drawings will illustrate the behavior just described. The numeral 36 denotes a positive half-cycle of a single phase of the external A.C. supply 10, and a single phase only of the three phase supply here shown and described for purposes of clarity. Upon the appearance of a positive potential corresponding to half wave 36 on the anode of an SCR, the SCR is ready to conduct upon, but only upon, the appearance of a signal on the gate of the SCR. If the gate signal is delayed for a time interval designated by A, the shaded area only of the positive half cycle corresponds to the current passed by the SCR. An increase in the time interval A (commonly designated as electrical angle A) thus has the effect of moving ordinate 38 to the right with a corresponding dimunition of the shaded area under 36 and a dimunition of the D.C. output to the thermoelectric module 34. Conversely, dimunition of electrical angle A increases the shaded area under 36 and the module receives more D.C. output.

Figure 4:
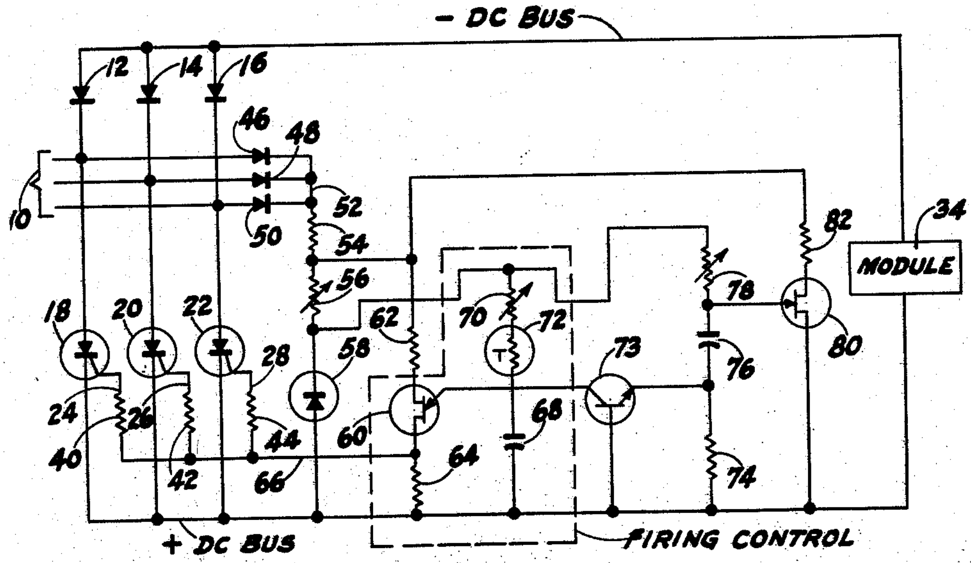
FIGURE 4 is a schematic view of the invention.

Referring now to FIGURE 4 of the drawings, a complete system embodying the present invention is illustrated. The numerals 10 to 28 inclusive, 34, 40, 42 and 44 denote the same elements as described with reference to FIGURE 2. The numerals 46, 48 and 50 denote conventional rectifier elements each connected to a common line 52. The numeral 54 denotes a fixed resistance and 56 denotes a variable resistance. A Zener diode 58 is connected between the lower terminal of resistance 56 and the positive D.C. bus and functions as a voltage regulator for the charging voltage of an oscillator. A unijunction transistor 60 has one base secured to the bottom of resistor 54 through resistance 62, resistor 64 connects the other base to the positive D.C. bus line 66 makes a common connection with the gates through resistors 40, 42 and 44 and is secured to the top of resistor 64. Capacitor 68 is secured across the emitter and the second base of transistor 60 through resistor 64. A variable resistor 70 is placed in series with a thermistor 72. Elements 60, 68, 70 and 72 define a common unijunction relaxation oscillator whose periodicity is a function of the resistances of resistors 70 and 72 and capacitance of capacitor 68.

The operation of the elements so far set forth in the description of FIGURE 4 of the drawings is as follows.

The unijunction transistor 60 conducts whenever the capacitor 68 is charged to a predetermined potential, i.e., when its potential reaches a certain fraction of the potential difference across the two bases of 60, and upon conduction an IR drop is developed across resistor 64, this potential appearing at the gates of the silicon control rectifiers. Whichever silicon control rectifier has a great enough positive anode voltage at this time conducts. The rate at which capacitor 68 is charged is a function of the combined resistances of variable resistor 70 and thermistor 72 and the capacitance of 68. Thus by changing either or both of these resistances (with capacitance of 68 fixed), the time required for capacitor 68 to accumulate enough charge to thereupon cause interbase conduction of 60 may be varied. This variation changes an electrical angle corresponding to A described with reference to FIGURE 3 and, as set out in that description, the D.C. output to the module 34 varies inversely with the angle. Upon conduction through one of the SCR elements, the rectifier element 46, 48 or 50 which is most negative conducts and the charging potential for capacitor 68 drops to zero. Thus the electrical angle is measured from the same initial point for each of the three external A.C. supply phases.

Variations from a desired control temperature within a refrigerated atmosphere adjacent module 34 are sensed by the temperature sensing means 72, the latter being in heat exchange relationship with the refrigerated atmosphere, and changes in resistivity with changes from the control temperature function to maintain the temperature at the desired control point. Thus if the temperature of the refrigerated atmosphere drops from the control temperature, the resistance of thermistor 72 increases due to its negative resistance vs. temperature characterstic and the charging time of capacitor 68 (a function of $R_{72}C_{68}$) also increases. The electrical angle similarly increases, the D.C. output to the module 34 and hence the cooling action decreases and the temperature reduces at a slower rate to the control point. Conversely, an increase over the control point diminishes the thermistor resistance, diminishing the electrical angle, and the cooling action of module 34 increases until the control temperature is attained. It will be apparent now that the function of variable resistance 70 is to fix the control temperature at the desired point. This may be done at the place of manufacture or may be manually set by the user.

In the preceding discussion, variation in the electrical angle has been described as effected by a change in the resistance of thermistor 72. Because the rate of accumulation of charge on a capacitor is a function of the product of the capacitance of the capacitor and the resistance in series therewith, it will be apparent that variation of the electrical angle may also be made by varying the capacitance of capacitor 68. Similarly, variation in the electrical angle may obviously be made by simultaneously varying whatever resistance is in series with capacitor 68 (resistances 70 and 72) and the capacitance of capacitor 68. While not in great commercial production at this time, capacitors whose capacitance changes with changes in ambient temperature are available and hence the invention admits of the use of such a capacitor as the sensing means 32 of FIGURE 2 in lieu of the thermistor 72 of FIGURE 4. Similarly, the sensing means 32 of FIGURE 2 may include both a temperature dependent resistance in series with a temperature dependent capacitance to thereby vary the electrical angle. In such a construction, a resistor and a capacitor both having a negative resistance/capacitance vs. temperature characteristic may be employed to effect a greater change in the electrical angle A for every temperature degree departure from a selected control point.

An alternative construction of the firing control or pulsing circuit embodies an inductance in lieu of the capacitance 68. For short time intervals in an RL series circuit, the time required to attain a predetermined current is a function of $L/R$. Such a circuit may also be employed to yield a time delay, synonymously, electrical angle A of FIGURE 3. An inductance L with a thermistor having a positive temperature coefficient of resistance (for cooling) in series therewith is substituted for the thermistor 72 and a resistance is substituted for the capacitance 68. A current surge through the inductance, corresponding to the positive half waves through 46, 48 and 50, does not reach a maximum immediately. Later, upon the attainment of a predetermined current through the inductance, corresponding to a predetermined time delay, the IR drop through the resistance, i.e., the resistance which was substituted for the capacitor 68 and the circuit functions as described above. For heating, the thermistor of this alternative construction would require a negative temperature coefficient of resistance.

Referring again to FIGURE 4 of the drawings, the numeral 73 denotes a conventional transistor whose collector is secured to the top of capacitor 68 and whose emitter is secured to the top of resistor 74 and the bottom of capacitor 76. The numeral 78 denotes a variable resistance and the emitter of another unijunction transistor 80 is secured between the bottom of 78 and the top of capacitor 76. A resistance 82 is in series with one of the bases of 80 and is secured to the bottom of resistor 54. Elements 74, 76, 78 and 80 define another unijunction relaxation oscillator whose periodicity is varied by resistance 78 to discharge capacitor 68 in the event of failure of the first unijunction relaxation oscillator to fire the gates of the silicon controlled rectifiers before the angle between the main three phase supply voltage and the pulsing of the gates reaches 120°. If the latter occurred, the rectified D.C. voltage would abruptly rise to maximum.

Whenever unijunction transistor 60 conducts through resistance 64 upon discharge of capacitor 68, conduction through any of the SCR elements 18, 20, 22 causes the interbase potential of unijunction transistors 60 and 80 to fall to zero, the positive potential to whichever anode 46, 48 or 50 is providing the interbase potential dropping to zero. Unijunction transistor 80 discharges capacitor 76 and hence 80 has no effect on this portion of the cycle.

Should the first unijunction oscillator fail to give a gate signal before 120° lag, unijunction transistor 80 will conduct, capacitor 76 will discharge through resistor 74, causing transistor 73 to discharge capacitor 68. In this manner of operation, the gates are never fired and the D.C. output voltage is zero. For retardation angles from zero to 120°, the variation in rectified voltage is over a range of 75%, i.e., maximum to 25% and such wide variation is great enough for the control purposes of this refrigeration system.

In the preceding, the invention has been described with reference to a refrigeration system, i.e., an environment wherein a controlled temperature is to be maintained generally lower than the external or ambient temperature. The invention is equally applicable to a heating system wherein the controlled temperature is generally higher than the ambient or external temperature.

To employ the invention as a heating system, it is only necessary to place the hot side of the thermoelectric module in heat exchange relationship with a heat exchange medium to be conditioned, and employ a resistance having a positive resistance vs. temperature characteristic in lieu of the negative resistance vs. temperature characteristic of the thermistor 72 of FIGURE 4. This may be accomplished by a reorientation of the module with respect to the conditioned atmosphere or by the use of a reversing switch to reverse the polarity of the module so that what was the cold side for cooling would be the hot side for heating. A capacitance having a positive capacitance vs. temperature characteristic may also be employed in combination with either a fixed resistance or one which varies as temperature. In the latter alternative, it is obvious that both the resistance and the capacitance would be placed in heat exchange relationship with a heat exchange medium.

In the illustrated embodiment of the invention of FIGURE 4, the external power supply 10 also provides the power for the unijunction relaxation oscillator which determines an electrical angle and hence the direct current output to the thermoelectric module 34. Such an arrangement, as above described, also provides for the measurement of the electrical angle from the same point. The invention is not limited however to a common power supply but also embraces a system having a separate power supply for the oscillator. If desired, the frequency of the unijunction pulses may vary instead of being held the same to vary the cooling output. A variable frequency oscillator with a separate power supply could be employed.

While silicon control rectifiers have been found suitable it will be apparent to those versed in the art that a power transistor could be employed and hence the invention is not to be regarded as limited by the specific solid state diode devices illustrated.

Further, while the invention has been described with respect to a three phase system, it will be apparent that a single phase system may be used, or, any convenient number of phases.

We claim:

1. A thermal conditioning system employing a thermoelectric module including: rectifier means for converting alternating to direct current, means for thermoelectrically conditioning a heat exchange medium, said thermoelectric conditioning means comprising the load of said rectifier means, a sensing means in heat exchange relation with a heat exchange medium whereby the temperature of the sensing means varies as the temperature of the medium, the sensing means having a temperature dependent electrical property, an oscillator coupled to the rectifier means, the output of the rectifier means being dependent upon the periodicity of the oscillator, the periodicity of the oscillator being a function of the electrical property of the temperature sensing means, whereby a change in the electrical property of the sensing means occasioned by a change in temperature of the heat exchange medium varies the output of the rectifier to thereby vary the conditioning action of the thermoelectric conditioning means.

2. A thermal conditioning system employing a thermoelectric module including: a gate controlled rectifier means for converting alternating to direct current whose conduction is controlled by an electrical pulse applied to its gate, means for supplying electrical pulses of varying periodicity to the gate of said rectifier means, means for thermoelectrically conditioning a heat exchange medium, said thermoelectric conditioning means comprising the load of said rectifier means, a sensing means in heat exchange relationship with a heat exchange medium whereby the temperature of the sensing means varies as the temperature of the medium, the sensing means having a temperature dependent electrical property, means coupling the said sensing means to the said periodicity varying means, variations in the said electrical property varying the periodicity of said pulses to thereby vary the magnitude of the rectified current, whereby a change in the electrical property of the sensing means occasioned by a change in the temperature of the medium varies the periodicity of the pulses to thereby vary the conditioning action of the thermoelectric conditioning means.

3. The thermal conditioning system of claim 2 wherein said sensing means is a resistance which changes with changes in its ambient temperature and wherein the said means for supplying pulses of varying periodicity to the gate of the rectifier means includes a transistor whose conduction is controlled by the potential across a capacitor, the charging period of the capacitor being a function of said temperature responsive resistance.

4. The thermal conditioning system of claim 2 wherein said sensing means is a capacitance which changes with changes in its ambient temperature and wherein the said means for supplying pulses of varying periodicity to the gate of the rectifier means includes a transistor whose conduction is controlled by the potential across the said capaictor, the charging period of the capacitor being a function of said temperature responsive capacitance.

5. The thermal conditioning system of claim 2 wherein said sensing means includes a resistance in series with a capacitance, both of which change their electrical property with changes in their ambient temperature and wherein the said means for supplying pulses of varying periodicity to the gate of the rectifier means includes a transistor whose condition is controlled by the potential across the said capacitance, the charging period of said capacitance being a function of both the said resistance and the said capacitance.

6. The thermal conditioning system of claim 2 including an inductance in series with resistance, at least a portion of said resistance changing with changes in ambient temperature and comprising said sensing means, said means for supplying pulses of varying periodicity to the gate including a transistor whose conduction is controlled by the potential drop across at least a portion of said resistance.

7. A thermal conditioning system employing a thermoelectric module comprising: gate controlled rectifier means for converting alternating to direct current, means for varying the electrical angle between the appearance of a potential difference of one algebraic sign across said rectifier means and the appearance of a pulse on said gate, means for thermoelectrically conditioning a heat exchange medium, said thermoelectric conditioning means comprising the load of said rectifier means, a sensing means in heat exchange relationship with a heat exchange medium whereby the temperature of the sensing means varies as the temperature of the medium, the sensing means having a temperature dependent electrical property, means coupling the said sensing means to the means for varying the said electrical angle, the said electrical property varying the said electrical angle to thereby vary the magnitude of the rectified current, whereby a change in the electrical property of the sensing means occasioned by a change in the temperature of the medium varies the electrical angle to thereby vary the conditioning action of the termoelectric conditioning means.

8. The thermal conditioning system of claim 7 wherein the said sensing means is a resistor.

9. The thermal conditioning system of claim 7 wherein the said sensing means is a capacitor.

10. The thermal conditioning system of claim 7 wherein the said sensing means is a capacitance in series with a resistance.

11. The thermal conditioning system of claim 8 including an inductance in series with the said resistor.

12. A thermal conditioning system employing a thermoelectric module including: rectifier means for converting alternating to direct current, means for thermoelectrically conditioning a heat exchange medium, said thermoelectric conditioning means comprising a load of said rectifier means, a sensing means in heat exchange relationship with a heat exchange medium whereby the temperature of the sensing means varies as the temperature of the medium, the sensing means having a temperature dependent electrical property, gate control means coupled to said rectifier means, the said sensing means also coupled to the said rectifier means, said sensing means controlling the rectifier means and thereby varying the electrical angle between the initial positive portions of the half-waves and the portions of the half-waves which are fed to the said thermoelectric conditioning means from the said rectifier, whereby a change in the electrical property of the sensing means occasioned by a change in temperature of the heat exchange medium varies the gate control to thereby vary the output of the rectifier to thereby varying the conditioning action of the thermoelectric conditioning means.

References Cited in the file of this patent

UNITED STATES PATENTS

| | | |
|---|---|---|
| 2,986,009 | Gaysowski | May 30, 1961 |
| 3,071,676 | Van Sandwyk | Jan. 1, 1963 |